United States Patent
Rao et al.

(10) Patent No.: US 10,546,944 B2
(45) Date of Patent: Jan. 28, 2020

(54) SEMICONDUCTOR DEVICE AND METHOD OF FABRICATING THE SAME

(71) Applicant: Nuvoton Technology Corporation, Hsinchu Science Park (TW)

(72) Inventors: Subramanya Jayasheela Rao, Karnataka (IN); Vinay Suresh, Bangalore (IN); Po-An Chen, Toufen (TW)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 39 days.

(21) Appl. No.: 15/823,007

(22) Filed: Nov. 27, 2017

(65) Prior Publication Data

US 2018/0182863 A1   Jun. 28, 2018

(30) Foreign Application Priority Data

Dec. 23, 2016   (TW) .............................. 105142919 A

(51) Int. Cl.
*H01L 29/66* (2006.01)
*H01L 21/04* (2006.01)
(Continued)

(52) U.S. Cl.
CPC .... *H01L 29/66681* (2013.01); *H01L 21/0415* (2013.01); *H01L 21/761* (2013.01);
(Continued)

(58) Field of Classification Search
CPC .............. H01L 21/74; H01L 21/823493; H01L 21/823892; H01L 29/66681;
(Continued)

(56) References Cited

U.S. PATENT DOCUMENTS 6,729,886 B2    5/2004  Efland et al.
7,960,222 B1 *  6/2011  Kwon ............. H01L 21/823418
                                                         438/197
(Continued)

FOREIGN PATENT DOCUMENTS

TW    200901466 A    1/2009
TW    201310653 A    3/2013
(Continued)

OTHER PUBLICATIONS

Notice of Allowance dated Dec. 14, 2017 in TW Application No. 105142919.

*Primary Examiner* — Bitew A Dinke
(74) *Attorney, Agent, or Firm* — Muncy, Geissler, Olds & Lowe, P.C.

(57) ABSTRACT

A semiconductor device includes a substrate having a first conductive type. An epitaxial layer having a second conductive type is disposed on the substrate. A first buried layer of the second conductive type is disposed within a high side region of the substrate. A second buried layer of the second conductive type is disposed directly above the first buried layer of the second conductive type. A top surface of the first buried layer of the second conductive type and a top surface of the second buried layer of the second conductive type are apart from a top surface of the epitaxial layer by different distances. A dopant concentration of the first buried layer of the second conductive type is less than that of the second buried layer of the second conductive type.

6 Claims, 4 Drawing Sheets

(51) Int. Cl.
    *H01L 29/78*       (2006.01)
    *H01L 27/092*    (2006.01)
    *H01L 21/761*    (2006.01)
    *H01L 29/10*       (2006.01)
    *H01L 21/8238*   (2006.01)
    *H01L 29/08*       (2006.01)
    *H01L 29/423*    (2006.01)

(52) U.S. Cl.
    CPC ...... *H01L 27/0922* (2013.01); *H01L 29/1083* (2013.01); *H01L 29/7816* (2013.01); *H01L 21/823892* (2013.01); *H01L 29/086* (2013.01); *H01L 29/0878* (2013.01); *H01L 29/42368* (2013.01)

(58) Field of Classification Search
    CPC ............ H01L 29/0415; H01L 29/7816; H01L 29/1083; H01L 27/0922; H01L 21/761; H01L 21/0415; H01L 29/086; H01L 29/42368; H01L 29/0878
    See application file for complete search history.

(56) References Cited

U.S. PATENT DOCUMENTS

| | | | |
|---|---|---|---|
| 2008/0073745 A1 | 3/2008 | Tang et al. | |
| 2011/0215402 A1* | 9/2011 | Lee | H01L 29/063 257/335 |
| 2012/0018804 A1* | 1/2012 | Khemka | H01L 29/1083 257/337 |
| 2012/0086052 A1* | 4/2012 | Chen | H01L 29/0607 257/288 |
| 2012/0126322 A1* | 5/2012 | Ko | H01L 21/76202 257/339 |
| 2012/0241861 A1* | 9/2012 | Chen | H01L 29/0634 257/339 |
| 2012/0267715 A1* | 10/2012 | Chou | H01L 29/1045 257/336 |
| 2013/0020680 A1* | 1/2013 | Chen | H01L 29/866 257/603 |
| 2013/0093016 A1* | 4/2013 | Ko | H01L 29/66659 257/343 |
| 2014/0027811 A1* | 1/2014 | Chen | H01L 29/7436 257/137 |
| 2014/0054656 A1* | 2/2014 | Chen | H01L 21/823481 257/288 |
| 2014/0061788 A1* | 3/2014 | Chen | H01L 29/7816 257/339 |
| 2014/0264585 A1* | 9/2014 | Moon | H01L 29/7816 257/343 |
| 2015/0048452 A1* | 2/2015 | Chen | H01L 29/7823 257/343 |
| 2015/0325639 A1* | 11/2015 | Liao | H01L 29/41758 327/434 |
| 2016/0064494 A1* | 3/2016 | Chan | H01L 29/7816 257/339 |
| 2016/0240657 A1* | 8/2016 | Chan | H01L 29/7816 |
| 2016/0365410 A1* | 12/2016 | Chang | H01L 29/7816 |
| 2018/0190766 A1* | 7/2018 | Wen | H01L 21/761 |
| 2018/0190767 A1* | 7/2018 | Siddiqui | H01L 21/2253 |
| 2018/0190816 A1* | 7/2018 | Siddiqui | H01L 29/7823 |

FOREIGN PATENT DOCUMENTS

| | | |
|---|---|---|
| TW | 201314868 A | 4/2013 |
| TW | I493687 B | 7/2015 |
| TW | I517393 B | 1/2016 |
| TW | I520328 B | 2/2016 |

\* cited by examiner

SEMICONDUCTOR DEVICE AND METHOD OF FABRICATING THE SAME

CROSS REFERENCE TO RELATED APPLICATIONS

This application claims priority to Taiwan Patent Application no. 105142919, filed on Dec. 23, 2016, the entirety of which is incorporated by reference herein.

BACKGROUND OF THE INVENTION

Field of the Invention

The disclosure relates to a semiconductor device and its manufacturing method, and more particularly to a high-voltage semiconductor device and its manufacturing method.

Description of the Related Art

Since high-voltage integrated circuits (HVIC) have the advantages of being cost effective and being easily compatible with other processes, they are widely applied in light-emitting diodes (LED), display driver IC devices, power supplies, power management system, communication system, and automobile power control systems. However, improvement of the known high-voltage circuits is limited because of problems of the latch up effect, low breakdown voltage, slow device switching speeds, and having larger device areas.

Therefore, a high-voltage semiconductor device is needed to overcome the above disadvantages in this technical field.

BRIEF SUMMARY OF INVENTION

The present disclosure provides a semiconductor device. The semiconductor device includes a substrate having a first conductive type. The substrate includes a high side region, a low side region separated from the high side region, and a level shift region and an isolation region disposed between the high side region and the low side region. The isolation region separates the level shift region from the high side region. The semiconductor device further includes an epitaxial layer disposed on the substrate. The epitaxial layer has a second conductive type, and the first conductive type is different from the second conductive type. The semiconductor device further includes a first buried layer of the second conductive type disposed in the high side region. The semiconductor device further includes a second buried layer of the second conductive type disposed directly above the first buried layer of the second conductive type. The semiconductor device further includes a top surface of the first buried layer of the second conductive type and a top surface of the second buried layer of the second conductive type are apart from a top surface of the epitaxial layer by different distances respectively, and a dopant concentration of the first buried layer of the second conductive type is less than a dopant concentration of the second buried layer of the second conductive type.

The present disclosure also provides a method for manufacturing a semiconductor device. The method for manufacturing a semiconductor device includes providing a substrate having a first conductive type. The substrate includes a high side region, a low side region separated from the high side region, and a level shift region and an isolation region disposed between the high side region and the low side region. The isolation region separates the level shift region from the high side region. The method for manufacturing a semiconductor device further includes performing a first ion implantation process to form a first buried layer of the second conductive type in the substrate in the high side region. The first conductive type is different from the second conductive type. The method for manufacturing a semiconductor device further includes performing a second ion implantation process to form a second buried layer of the second conductive type directly above the first buried layer of the second conductive type. The method for manufacturing a semiconductor device further includes performing an epitaxial growth process to form an epitaxial layer on the substrate. The epitaxial layer has the second conductive type. The method for manufacturing a semiconductor device further includes, after the formation of the epitaxial layer, the second buried layer of the second conductive type diffuses and extends into the epitaxial layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
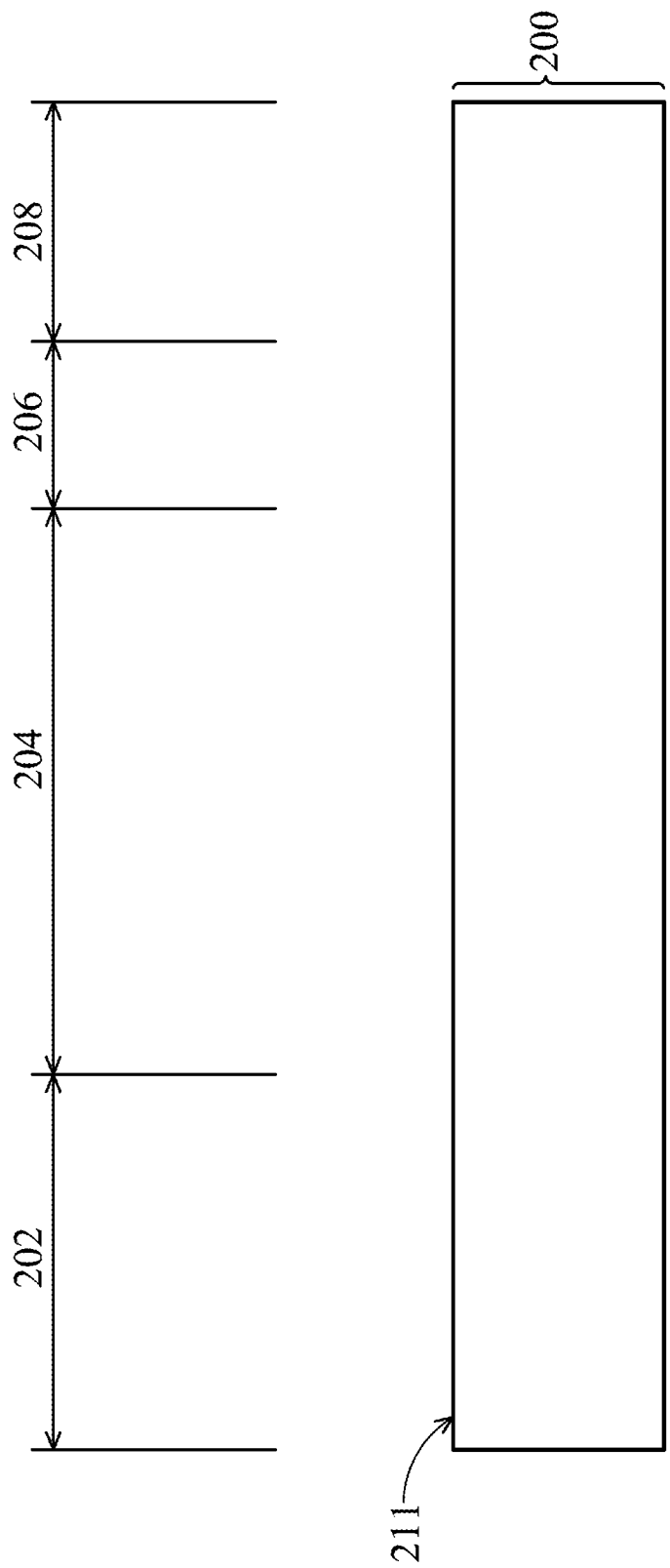
FIGS. 1 to 4 are cross-sectional representations of various stages of forming a semiconductor device in accordance with some embodiments.

In order to illustrate the purposes, features, and advantages of the invention, the preferred embodiments and drawings of the invention are shown in detail as follows. The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The embodiment of the present disclosure provides a semiconductor device for high-voltage integrated circuits (HVIC). A deep N-type buried layer (NBL) and a shallow NBL are formed in the substrate in the high side region of the semiconductor device by different ion implantation processes. The deep NBL is disposed directly beneath the shallow NBL, and the dopant concentration of the deep NBL is less than the dopant concentration of the shallow NBL. The terms "deep" and "shallow" herein relates to the distance between a top surface of the buried layer and a top surface of an epitaxial layer of the semiconductor device. For example, the distance between the top surface of the deep NBL and the top surface of the epitaxial layer of the semiconductor device is longer than the distance between the top surface of the shallow NBL and the top surface of the epitaxial layer of the semiconductor device. Moreover, the dopant doses used in the two different ion implantation processes to respectively form the deep NBL and the shallow NBL are both less than $10^{14}$ cm$^{-2}$. Therefore, the device surface doping profile may not be affected while forming the heavier doped shallow NBL. In addition, the deep NBL and the shallow NBL can effectively restrain the vertical punch-through effect in the high side region of the HVIC.

FIGS. 1 to 4 are cross-sectional representations of various stages of forming a semiconductor structure 500 in accordance with some embodiments of the present disclosure. Referring to FIG. 1, the substrate 200 is provided first. The substrate 200 is doped with dopant to have a first conductive type. For example, when the first conductive type is P-type, the substrate 200 may be a P-type substrate. In some embodiments of the present disclosure, the dopant concentration of the substrate 200 may be around $1 \times 10^{11}$-$1 \times 10^{15}$/cm$^3$, and the substrate 200 may be regarded as a lightly doped P-type substrate 200. Herein the term "lightly doped" means that the dopant concentration is lower than $1 \times 10^{15}$/cm$^3$. The substrate 200 may be a silicon substrate. In the other embodiments of the present disclosure, SiGe, bulk semiconductor, strained semiconductor, compound semiconductor, or other common semiconductor substrates may be used as the substrate 200.

As shown in FIG. 1, the substrate 200 includes a low side region 202, a high side region 208, and a level shift region 204 and an isolation region 206 disposed between the low side region 202 and the high side region 208. The isolation region 206 is disposed between the level shift region 204 and the high side region 208 to separate the level shift region 204 and the high side region 208 from each other. In some embodiments as shown in FIG. 1, the low side region 202, the level shift region 204, the isolation region 206, and the high side region 208 are arranged in the order from left to right in a direction that is parallel to the top surface 211 of the substrate 200.

In some embodiments of the present disclosure, the low side region 202 is to allow low-voltage integrated circuit (LVIC) devices, which has an operating voltage such as lower than 20V, to be formed on it. The high side region 208 is to allow high-voltage integrated circuit (HVIC) devices, which has an operating voltage such as higher than or equal to 600V, to be formed on it. Furthermore, the level shift region 204 may include laterally diffused metal oxide semiconductor (LDMOS) devices formed thereon. The isolation region 206 is to electrically isolate the low side region 202 and the high side region 208 when the gate of the LDMOS is turned off.

The source of the LDMOS device in the level shift region 204 may be electrically coupled to the LVIC devices in the low side region 202. Moreover, the drain of the LDMOS device in the level shift region 204 may be electrically coupled to the HVIC devices in the high side region 208 by metal interconnect crossing the isolation region 206 (not shown in the drawings). When being turned on, the LDMOS device can be used to shift the low voltage level of the low side region 202 to the high voltage level of the high side region 208.

Figure 2:
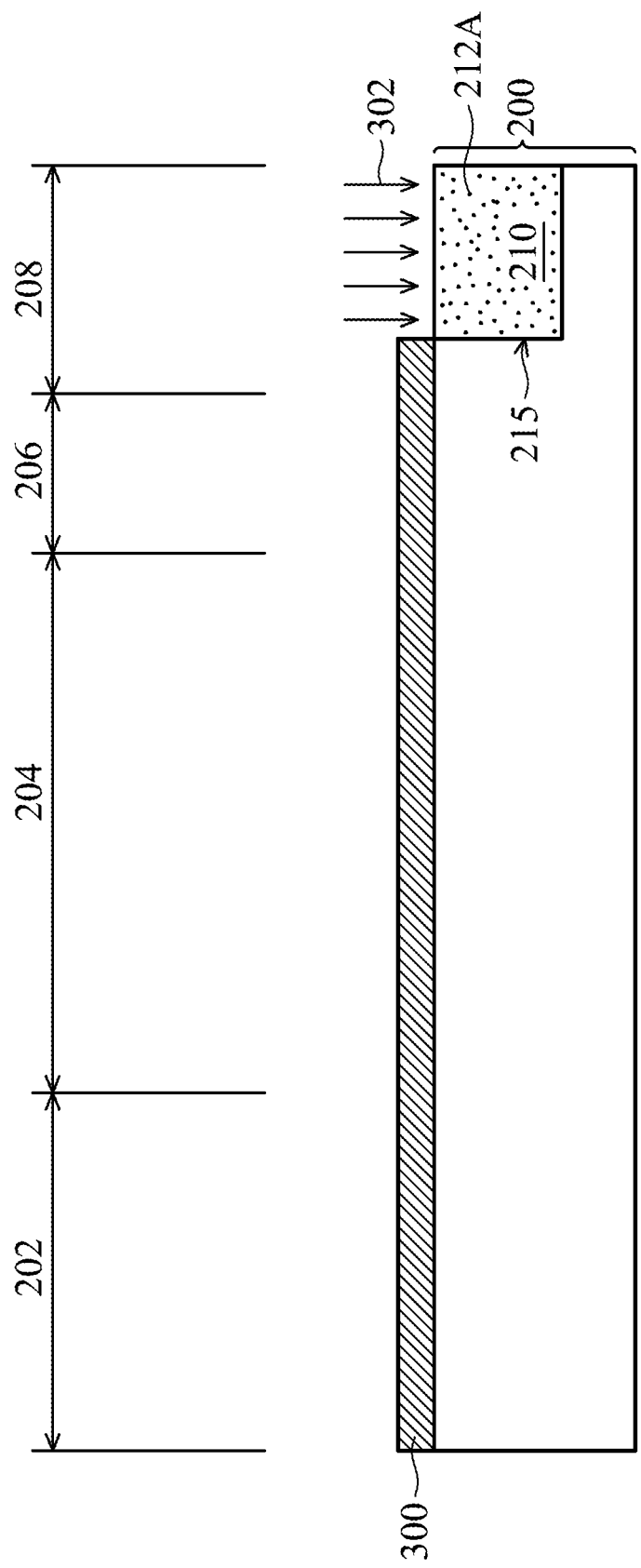

Referring to FIG. 2, a photolithography process may be performed to form a mask pattern 300 on the top surface 211 of the substrate 200. The mask pattern 300 may expose a portion of the substrate 200 in the high side region 208 and define the area of the first buried doped region 210 of the second conductive type to be formed in subsequent processes. It should be noted that the mask pattern 300 does not expose the substrate 200 in the low side region 202, the level shift region 204, and the isolation region 206. Afterwards, by using the mask pattern 300 as a mask, an ion implantation process 302 is performed to implant a first dopant 212A, so as to form a first buried doped region 210 of the second conductive type in the substrate 200 in the high side region 208. Next, the mask pattern 300 is removed. The first buried doped region 210 of the second conductive type has a second conductive type, and the second conductive type is different from the first conductive type. For example, when the first conductive type is P-type, the second conductive type is N-type, and the first buried doped region 210 of the second conductive type may be regarded as an N-type buried doped region 210.

As shown in FIG. 2, it should be noted that the ion implantation process 302 implants the first dopant 212A in the substrate 200 in only the high side region 208 to form the first buried doped region 210 of the second conductive type, but does not implant the first dopant 212A in the low side region 202, the level shift region 204, and the isolation region 206 to form other second conductive type buried doped regions at the same time. The first buried doped region 210 of the second conductive type is completely disposed in the high side region 208. In other words, the edge 215 of the first buried doped region 210 of the second conductive type is completely disposed in the high side region 208.

In some embodiments of the present disclosure, the first dopant 212A used in the ion implantation process 302 may include phosphorous (P). The dopant dose used in the ion implantation process 302 may be in a range of $1 \times 10^{11}$-$5 \times 10^{13}$/cm$^2$. Therefore, the dopant concentration of the formed first buried doped region 210 of the second conductive type may be in a range of $1 \times 10^{15}$-$5 \times 10^{18}$/cm$^3$. After the ion implantation process 302, an annealing process may be performed to activate the first dopant 212A and make the first dopant 212A in the first buried doped region 210 of the second conductive type uniform.

Figure 3:
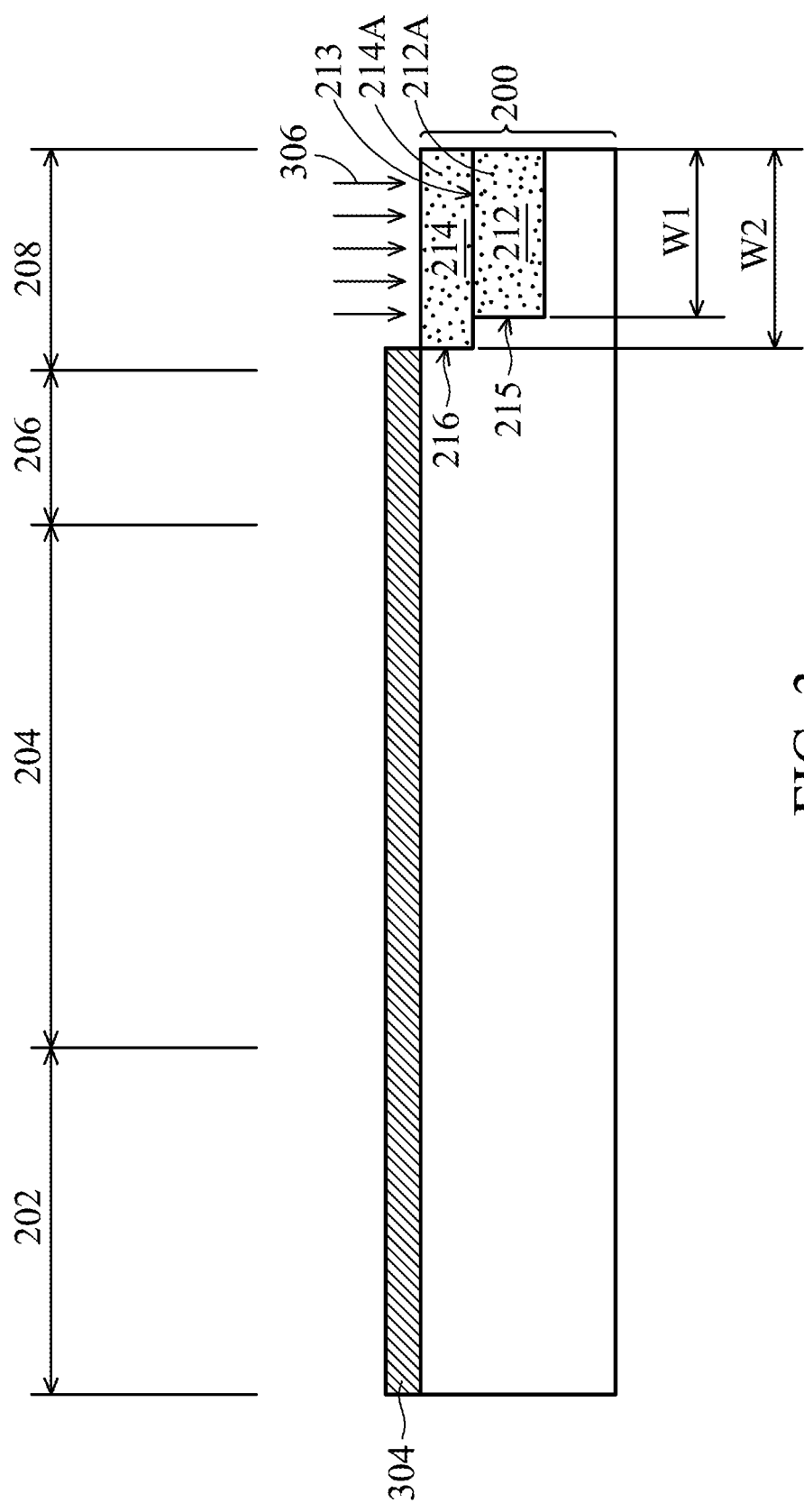

Next, referring to FIG. 3, another photolithography process may be performed to form a mask pattern 304 on the top surface 211 of the substrate 200. The mask pattern 304 may expose a portion of the substrate 200 in the high level region 208 and define the area of the second buried layer 214 of the second conductive type to be formed in subsequent processes. The mask pattern 304 may completely expose the first buried doped region 210 of the second conductive type. It should be noted that the mask pattern 304 does not expose the substrate 200 in the low side region 202, the level shift region 204, and the isolation region 206. Afterwards, by using the mask pattern 304 as a mask, another ion implantation process 306 is performed to implant a second dopant 214A. By changing the dopant concentration of the portion of the first buried doped region 210 of the second conductive type near the top surface 211 of the substrate 200, the first buried doped region 210 of the second conductive type shown in FIG. 2 is transformed to a first buried layer 212 of the second conductive type, and a second buried layer 214 of the second conductive type disposed over the first buried layer 212 of the second conductive type is formed. Next, the mask pattern 304 is removed. The second buried layer 214 of the second conductive type has a second conductive type. For example, when the first conductive type is P-type, the second conductive type is N-type, and the first buried layer 212 of the second conductive type and the second buried layer 214 of the second conductive type may be regarded as an N-type buried layer 212 and an N-type buried layer 214 respectively. In some embodiments of the present disclosure, the top surface 213 of the first buried layer 212 of the second conductive type formed after ion implantation processes 302 and 306 is lower than the top surface 211 of the substrate 200.

As shown in FIG. 3, it should be noted that the ion implantation process 306 implants the second dopant 214A in the substrate 200 in only the high level region 208 to form the second buried layer 214 of the second conductive type, but does not implant the second dopant 214A in the low side region 202, the level shift region 204, and the isolation region 206 to form other second conductive type buried layers at the same time. The second buried layer 214 of the second conductive type is completely disposed in the high side region 208. In other words, the edge 216 of the second buried layer 214 of the second conductive type is completely disposed in the high side region 208.

In the embodiment of the present disclosure as shown in FIG. 3, the first dopant 212A used in the ion implantation process 302 and the second dopant 214A used in the ion implantation process 306 can belong to the same dopant group (e.g. the VA group). It should be noted that the first dopant 212A used in the ion implantation process 302 and the second dopant 214A used in the ion implantation process 306 are different dopants. Described in more detail, the atomic mass of the first dopant 212A is smaller than the atomic mass of the second dopant 214A. In addition, the diffusivity of the first dopant 212A is greater than the diffusivity of the second dopant 214A. For instance, when the first dopant 212A is phosphorous (P), the second dopant 214A is arsenic (As).

In the embodiment of the present disclosure as shown in FIG. 3, the dopant dose used in the ion implantation process 306 to form the second buried layer 214 of the second conductive type is configured to be greater than the dopant dose used in the ion implantation process 302 to form the first buried doped region 210 of the second conductivity type (as shown in FIG. 2). For example, the dopant dose used in the ion implantation process 306 may be in a range of $1\times10^{13}$-$1\times10^{15}$/cm$^2$, such as $5\times10^{13}$/cm$^2$. It should be noted that the dopant concentration of the second buried layer 214 of the second conductive type formed after the two ion implantation processes 302 and 306 may be in a range of $1\times10^{17}$-$1\times10^{20}$/cm$^3$, and the dopant concentration of the first buried layer 212 of the second conductive type formed after the two ion implantation processes 302 and 306 may be in a range of $1\times10^{15}$-$1\times10^{18}$/cm$^3$. In other words, the dopant concentration of the second buried layer 214 of the second conductive type formed after the two ion implantation processes 302 and 306 is higher than the dopant concentration of the first buried layer 212 of the second conductive type formed after the two ion implantation processes 302 and 306 by one to two orders of magnitude.

It should be noted that in some embodiments of the present disclosure, the dopant dose used in the two ion implantation processes 302 and 306 to form the first buried layer 212 of the second conductive type and the second buried layer 214 of the second conductive type are both lower than $5\times10^{18}$ cm$^{-2}$. Therefore, the surface doping concentration of the ultimate semiconductor device is not affected.

The atomic masses of the dopants respectively doped in the first buried layer 212 of the second conductive type and the second buried layer 214 of the second conductive type are different. Compared to the second buried layer 214 of the second conductive type, the first buried layer 212 of the second conductive type has a lighter dopant, and therefore has a greater diffusivity. As a result, the first buried layer 212 of the second conductive type and the second buried layer 214 of the second conductive type can be configured to have different widths. For example, the first buried layer 212 of the second conductive type has a first width W1, the second buried layer 214 of the second conductive type has a second width W2, and the second width W2 is greater than the first width W1.

After the ion implantation process 306 as shown in FIG. 3 is performed, another anneal process may be performed to activate the second dopant 214A and make the dopant concentration in the second buried layer 214 of the second conductive type uniform. In some embodiments of the present disclosure, the bottom surface of the second buried layer 214 of the second conductive type physically contacts the top surface 213 of the first buried layer 212 of the second conductive type. Furthermore, after the process as shown in FIG. 3, the top surface of the second buried layer 214 of the second conductive type is essentially coplanar with the top surface 211 of the substrate 200.

Figure 4:
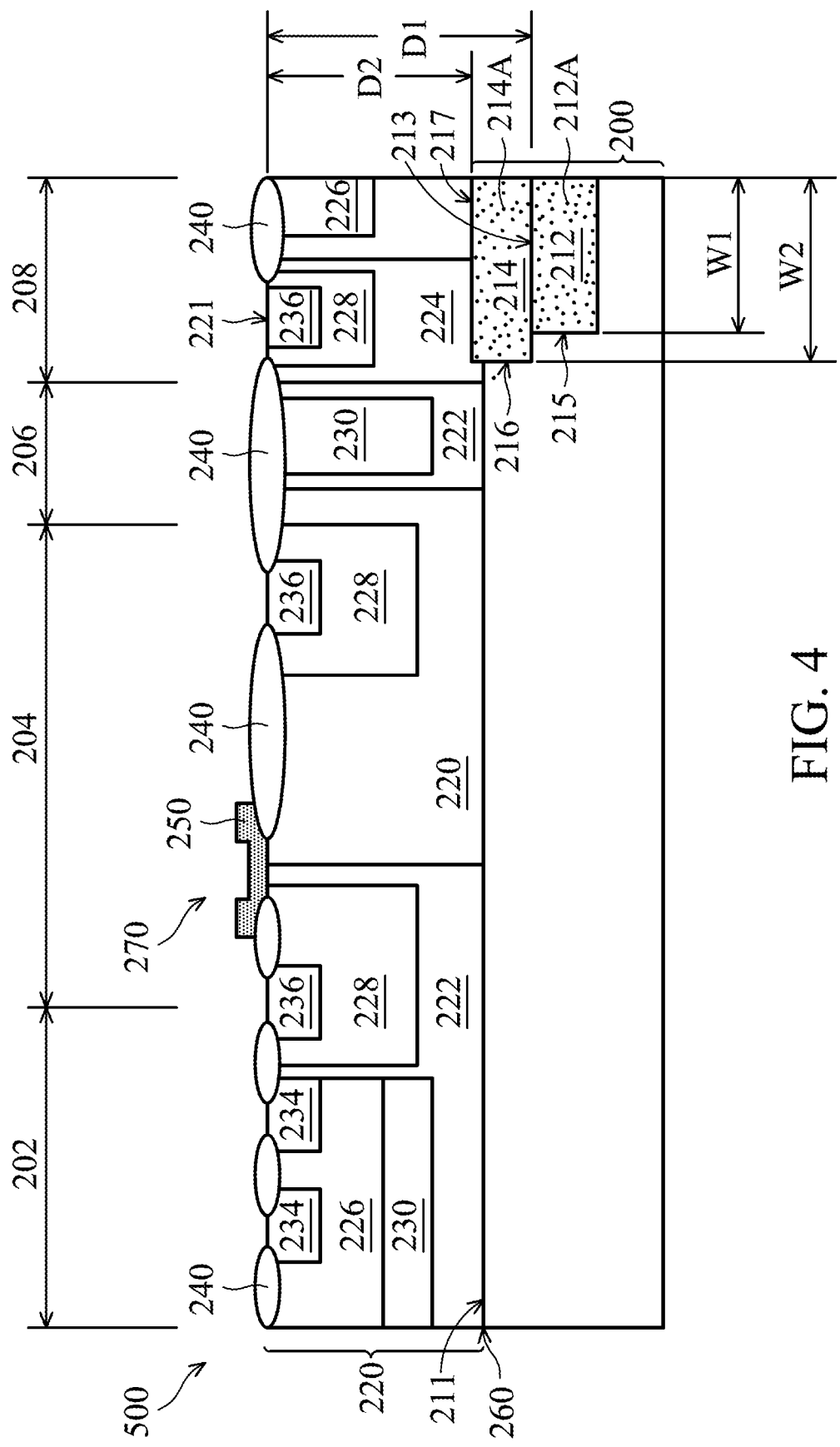

Next, as shown in FIG. 4, an epitaxial growth process is performed to entirely form an epitaxial layer 220 on the top surface 211 of the substrate 200. The epitaxial growth process may include metal-organic chemical vapor deposition (MOCVD), metal-organic vapor-phase epitaxy (MOVPE), plasma-enhanced chemical vapor deposition (plasma-enhanced CVD), remote plasma chemical vapor deposition (RP-CVD), molecular beam epitaxy (MBE), hydride vapor phase epitaxy (HVPE), liquid phase epitaxy (LPE), chloride vapor phase epitaxy (Cl-VPE), or the like. In some embodiments of the present disclosure, phosphine or arsine may be added in the reactant gas to perform in-situ doping to form the epitaxial layer 220 of the second conductive type during the epitaxial growth process. In some embodiments of the present disclosure, an un-doped epitaxial layer (not shown) may be epitaxially grown first, and then the un-doped epitaxial layer is doped by phosphorous ions or arsenic ions to form the epitaxial layer 220.

The material of the epitaxial layer 220 may include silicon, germanium, silicon and germanium, III-V group compound, or combinations thereof. The epitaxial layer 220 has a second conductive type, and the second conductive type is different from the first conductive type. For example, when the first conductive type is P-type, the second conductive type is N-type, and the epitaxial layer 220 may be regarded as an N-type epitaxial layer 220. In some embodiments of the present disclosure, the epitaxial layer 220 may have dopant such as phosphorous (P), and the thickness of the epitaxial layer 220 may be in a range of from 2 μm to 8 μm.

During the epitaxial growth process to form the epitaxial layer 220, the second buried layer 214 of the second conductive type diffuses and extends into the epitaxial layer 220. This means that after the formation of the epitaxial layer 220, the top surface 217 of the second buried layer 214 of the second conductive type may be disposed above the top surface 211 of the substrate 200.

As shown in FIG. 4, the top surface 213 of the first buried layer 212 of the second conductive type and the top surface 217 of the second buried layer 214 of the second conductive type are apart from the top surface 221 of the epitaxial layer 220 by different respective distances. Specifically, the top surface 213 of the first buried layer 212 of the second conductive type is separated from the top surface 221 of the epitaxial layer 220 by a distance D1. The top surface 217 of the second buried layer 214 of the second conductive type is away from the top surface 221 of the epitaxial layer 220 by a distance D2, and the distance D1 is longer than the distance D2.

Next, as shown in FIG. 4, several ion implantation processes are performed to implant different dopants in the epitaxial layer 220 in the low side region 202, the level shift region 204, the isolation region 206, and the high side region 208 respectively to form a high-voltage well region of the first conductive type 222 in the epitaxial layer 220 in the low side region 202, the level shift region 204, and the isolation region 206. Also a high-voltage well region 224 of the second conductive type in the epitaxial layer 220 in the high side region 208 is formed. For example, when the first conductive type is P-type, the second conductive type is N-type. The high-voltage well region 222 of the first conductive type may be regarded as a high-voltage P-type well (HVPW) region 222, and the high-voltage well region 224 of the second conductive type may be regarded as a high-voltage N-type well (HVNW) region 224. In some embodiments of the present disclosure, the bottom surfaces of the high-voltage well region 222 of the first conductive type and the high-voltage well region 224 of the second conductive type may be disposed in the epitaxial layer 220, and may be aligned with the boundary 260 between the substrate 200 and the epitaxial layer 220 (the same position as the top surface 211 of the substrate 200).

Next, as shown in FIG. 4, several ion implantation processes are performed to implant different dopants in the epitaxial layer 220 in the low side region 202, the level shift region 204, the isolation region 206, and the high side region 208 respectively to form a drift doped region 230 of the first conductive type in the epitaxial layer 220 in the low side region 202 and the isolation region 206. Also a drift doped region 228 of the second conductive type in the epitaxial layer 220 in the low side region 202, the level shift region 204, and the high side region 208 is formed. For example, when the first conductive type is P-type, the second conductive type is N-type. The drift doped region 230 of the first conductive type may be regarded as a P-type drift doped region 230, and the drift doped region 228 of the second conductive type may be regarded as a N-type drift doped region 228.

Next, as shown in FIG. 4, one or several ion implantation processes are performed to implant dopants in the epitaxial layer 220 in the low side region 202 and high side region 208 respectively to form a well region 226 of the first conductive type in the epitaxial layer 220 in the low side region 202 and the high side region 208. For example, when the first conductive type is P-type, the well region 226 of the first conductive type may be regarded as a P-type well region 226.

In some embodiments of the present disclosure, the dopant concentration of the high-voltage well region 222 of the first conductive type is less than the dopant concentration of the drift doped region 230 of the first conductive type, and the dopant concentration of the of the drift doped region 230 of the first conductive type is less than the dopant concentration of the well region 226 of the first conductive type. The dopant concentration of the epitaxial layer 220 is less than that of the high-voltage well region 224 of the second conductive type, and the dopant concentration of the high-voltage well region 224 of the second conductive type is less than that of the drift doped region 228 of the second conductive type.

Next, as shown in FIG. 4, a pad oxide layer (not shown) and a pad silicon nitride layer (not shown) may be formed on the top surface 221 of the epitaxial layer 220. After that, the pad oxide layer and the pad silicon nitride layer are etched to define the multiple active areas in the low side region 202, the level shift region 204, the isolation region 206, and the high side region 208. Then, local thermal oxidation may be used to form multiple isolation structures 240 on the top surface 221 of the epitaxial layer 220. As shown in FIG. 4, the multiple separated isolation structures 240 cover a portion of the top surface 221 of the substrate 200 in the low side region 202, the level shift region 204, and the isolation region 206. For instance, the isolation structure 240 defines the formation area of the pick-up doped region in the low side region 202, the formation area of the gate, the source doped region, and the drain doped region of the LDMOS device in the level shift region 204, and the formation area of the pick-up doped region in the high side region 208.

Next, as shown in FIG. 4, a gate structure 250 is formed on the top surface 221 of the epitaxial layer 220 in the level shift region 204. The gate structure 250 covers a portion of the isolation structure 240 on the high-voltage well region 222 of the first conductive type and the drift doped regions 228 of the second conductive type, and also covers the high-voltage well region 222 of the first conductive type and one of the drift doped regions 228 of the second conductive type (between the low side region 202 and the gate structure 250). The gate structure 250 separates from one of the other drift doped regions 228 of the second conductive type by a distance by another isolation structure 240 (between the gate structure 250 and the high side region 208). The method to form the gate structure 250 includes a thin film deposition process such as chemical vapor deposition (CVD) or atomic layer deposition (ALD) being performed, and a gate insulating material (now shown) being conformally formed on the top surface 221 of the epitaxial layer 220. Next, a thin film deposition process including physical vapor deposition (PVD), chemical vapor deposition (CVD), atomic layer deposition (ALD), or the like is performed to entirely form a gate conductive material on the gate insulating material. After that, a patterning process is performed to remove a portion of the gate conductive material and the gate insulating material and to form the gate structure 250.

Next, as shown in FIG. 4, several ion implantation processes are performed again to implant different dopants in the epitaxial layer 220 in the low side region 202, the level shift region 204, and the high side region 208 respectively to form a pick-up doped region 234 of the first conductive type on the well region 226 of the first conductive type in the epitaxial layer 220 in the low side region 202. Also the pick-up doped regions 236 of the second conductive type on different drift doped regions 228 of the second conductive type in the epitaxial layer 220 in the level shift region 204 and the high side region 208 are formed. For example, when the first conductive type is P-type, the second conductive type is N-type. The pick-up doped region 234 of the first conductive type may be regarded as a P-type pick-up doped region 234, and the pick-up doped region 236 of the second conductive type may be regarded as a N-type pick-up doped region 236.

In some embodiments of the present disclosure, the dopant concentration of the pick-up doped region 234 of the first conductive type is greater than the dopant concentration of the well region 226 of the first conductive type. The dopant concentration of the pick-up doped region 236 of the second conductive type is greater than the dopant concentration of the drift doped region 228 of the second conductive type.

After the above processes, an LDMOS device 270 is formed in the level shift region 204. The LDMOS device 270 has a gate structure 250, a source doped region, and a drain doped region. The drift doped region 228 of the second conductive type and the pick-up doped region 236 of the second conductive type between the low level region 202 and the gate structure 250 are to be the source doped region of the LDMOS device 270, and the drift doped region 228 of the second conductive type and pick-up doped region 236 of the second conductive type between the gate structure 250 and the high level region 208 are to be the drain doped region of the LDMOS device 270. Moreover, after the above processes, the semiconductor device 500 in some embodiments of the present disclosure may be completed.

The semiconductor device 500 in the present disclosure is provided to be used for a high-voltage semiconductor device in the high-voltage integrated circuits. In the present disclosure, two ion implantation processes are used to form two N-type buried layers (NBL) in the substrate in the high side region of the semiconductor device 500, and the two NBL are electrical floating. The two NBL include a deep NBL and a shallow NBL disposed directly above the deep NBL. The distance between the top surface of the deep NBL and the top surface of the epitaxial layer of the semiconductor device is longer than the distance between the top surface of the shallow NBL and the top surface of the epitaxial layer of the semiconductor device. In addition, the dopant concentration of the deep NBL is less than the dopant concentration of the shallow NBL by at least one order of magnitude. Since in the present disclosure the N-type buried layer structure is composed by both the shallow NBL and the deep NBL, the overall dopant concentration of the N-type buried layer may be increased, therefore the resistance may be reduced and the latch up performance of the device may be improved. Since in the present disclosure the N-type buried layer structure has lower resistance, the switching speed (dV/dt) of the high-voltage device is improved without changing the lateral rule (i.e. not increasing the device size). Moreover, the N-type buried layer structure composed by both the shallow NBL and the deep NBL can enhance the electrical isolation capability. The deep NBL can effectively improve the vertical punch-through effect in the high side region (such as the vertical punch-through effect from the P-type drift doped region to the P-type substrate beneath it). In addition, the dopant dose of the two ion implantation processes to form the shallow NBL and the deep NBL are both less than $1\times10^{14}$ cm$^{-2}$. There is no need to use ion implantation process with a high dopant dose (such as one that is higher than $1\times10^{15}$ cm$^{-2}$) which affects the ultimate surface doping profile of the semiconductor device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having a first conductive type, and comprising:
   a high side region;
   a low side region separated from the high side region; and
   a level shift region and an isolation region disposed between the high side region and the low side region, wherein the isolation region separates the level shift region from the high side region;
   an epitaxial layer disposed on the substrate, wherein the epitaxial layer has a second conductive type, and the first conductive type is different from the second conductive type;
   a first buried layer of the second conductive type disposed in the high side region, wherein the substrate in the level shift region does not have the first buried layer of the second conductive type;
   a second buried layer of the second conductive type disposed over the first buried layer of the second conductive type, wherein the first buried layer of the second conductive type has a first dopant, the second buried layer of the second conductive type has a second dopant, the first dopant is different from the second dopant, and an atomic mass of the first dopant is smaller than an atomic mass of the second dopant;
   wherein a top surface of the first buried layer of the second conductive type and a top surface of the second buried layer of the second conductive type are apart from a top surface of the epitaxial layer by different distances respectively, and wherein a dopant concentration of the first buried layer of the second conductive type is lower than a dopant concentration of the second buried layer of the second conductive type.

2. The semiconductor device as claimed in claim 1, wherein the dopant concentration of the first buried layer of the second conductive type is lower than the dopant concentration of the second buried layer of the second conductive type by one order of magnitude.

3. The semiconductor device as claimed in claim 1, wherein a bottom surface of the second buried layer of the second conductive type physically contacts the top surface of the first buried layer of the second conductive type.

4. The semiconductor device as claimed in claim 1, wherein the first buried layer of the second conductive type has a first width, the second buried layer of the second conductive type has a second width, and the second width is greater than the first width.

5. A method of manufacturing the semiconductor device as set forth in claim 1, comprising the steps of:
   providing a substrate having a first conductive type, wherein the substrate comprises:
   a high side region;
   a low side region separated from the high side region; and
   a level shift region and an isolation region disposed between the high side region and the low side region, wherein the isolation region separates the level shift region from the high side region;
   performing a first ion implantation process to form a first buried layer of the second conductive type in the substrate in the high side region, wherein the first conductive type is different from the second conductive type, and wherein the substrate in the level shift region does not have the first buried layer of the second conductive type;
   performing a second ion implantation process to form a second buried layer of the second conductive type directly above the first buried layer of the second conductive type, wherein the first ion implantation process implants a first dopant in the substrate in the high side region to form the first buried layer of the second conductive type, the second ion implantation process implants a second dopant in the substrate directly above the first buried layer of the second conductive type to form the second buried layer of the second conductive type, the first dopant is different from the second dopant, and an atomic mass of the first dopant is smaller than an atomic mass of the second dopant; and
   performing an epitaxial growth process to form an epitaxial layer on the substrate, wherein the epitaxial layer has the second conductive type, wherein after forming the epitaxial layer, the second buried layer of the second conductive type diffuses and extends into the epitaxial layer.

6. The method for manufacturing a semiconductor device as claimed in claim 5, wherein the second ion implantation process is performed after the first ion implantation process.

* * * * *